(12) United States Patent
Parker et al.

(10) Patent No.: US 7,183,836 B2
(45) Date of Patent: *Feb. 27, 2007

(54) FUSE SENSE CIRCUIT

(75) Inventors: Rachael Jade Parker, Forest Grove, OR (US); Martin S. Denham, Yamhill, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/127,501

(22) Filed: May 11, 2005

(65) Prior Publication Data

US 2005/0200385 A1  Sep. 15, 2005

Related U.S. Application Data

(62) Division of application No. 09/607,782, filed on Jun. 30, 2000, now Pat. No. 6,906,557.

(51) Int. Cl.
G01R 19/00 (2006.01)
H01H 85/00 (2006.01)

(52) U.S. Cl. .................. 327/525; 327/53; 323/316

(58) Field of Classification Search ............. 327/525, 327/53; 323/315, 316
See application file for complete search history.

(56) References Cited

U.S. PATENT DOCUMENTS

| 5,353,028 A | 10/1994 | De Wit et al. |
|---|---|---|
| 5,384,727 A | 1/1995 | Moyal et al. |
| 5,390,147 A | 2/1995 | Smarandoiu et al. |
| 5,412,349 A | 5/1995 | Young et al. |
| 5,418,487 A | 5/1995 | Armstrong, II |
| 5,708,291 A | 1/1998 | Bohr et al. |
| 5,731,733 A | 3/1998 | Denham |
| 5,789,970 A | 8/1998 | Denham |
| 5,959,445 A | 9/1999 | Denham |
| 6,081,162 A | 6/2000 | Johnson |
| RE36,781 E | 7/2000 | Lee et al. |
| 6,091,273 A | 7/2000 | Bernstein et al. |
| 6,107,857 A * | 8/2000 | Orisaka et al. ............ 327/333 |
| 6,201,432 B1 | 3/2001 | Lim et al. |
| 6,278,295 B1 | 8/2001 | Lovett |
| 6,753,720 B2 | 6/2004 | Kono et al. |

* cited by examiner

*Primary Examiner*—My-Trang Nu Ton
(74) *Attorney, Agent, or Firm*—Blakely, Sokoloff, Taylor & Zafman LLP

(57) ABSTRACT

A fuse sense circuit has a sense amplifier and a post amplifier (gain stage). The sense amplifier has a reference branch and one or more sense (or fuse) branches. The fuse sense circuit determines the state of the fuses using safe currents and provides much higher gain than prior art. The post amplifier is a scaled replica of the reference branch or one of the sense branches in that the devices in the post amplifier maintain the same ratio as similar devices in the reference branch, and components in the post amplifier each matches components in the reference branch. The sense amplifier output is interpreted by the post amplifier's matched gain stage and has a trip point that sufficiently tracks the reference voltage. The result is reduced process and voltage sensitivity, which allows lower differential fuse resistance to be accurately detected with a non-ideal sense amplifier. Multiple gain stages may be added to multiple sense branches for redundancy and single-ended sensing.

7 Claims, 4 Drawing Sheets

FUSE SENSE CIRCUIT

CROSS-REFERENCE TO RELATED APPLICATIONS

The present application is a Divisional application of U.S. Ser. No. 09/607,782, filed Jun. 30, 2000 now U.S. Pat. No. 6,906,557.

BACKGROUND

1. Field of the Invention

The invention relates to the field of integrated circuit devices. More particularly, the invention relates to circuits for sensing the state of a fuse device.

2. Background Information

In many integrated circuits, fuses are used to store information, form connections, program elements for redundancy, store identification or other information, or trim analog circuits by adjusting the resistance of a current path. These functions are typically referred to as "programming" a fuse.

To determine whether a fuse has been programmed, circuits that sense the state of fuses usually distinguish between programmed and unprogrammed fuses by detecting a change in the resistance of the fuse device from a low to a high value. Sometimes the difference in resistance between a programmed fuse and an unprogrammed fuse is so small that the resistance difference is difficult to detect. This is especially true for fuses with smaller geometries (e.g., line widths and device sizes), whose resistances can be harder to control in the manufacturing process. Conversely, sometimes the difference in resistance between a programmed fuse and an unprogrammed fuse is so large that there is a wide range of programmed resistance values as compared to their unprogrammed resistance values. This can be the case for polysilicon fuses whose unprogrammed resistance can vary by several ohms while the programmed resistance can vary across hundreds of ohms.

To accommodate newer technologies, circuits that sense the state of fuses must be sufficiently sensitive to reliably detect small changes in resistance to accurately discern between unprogrammed and programmed fuses. Merely increasing the current in a fuse sensing circuit to increase sensitivity is not a viable approach. If the current through an unprogrammed fuse is not low enough during sensing, the unprogrammed fuse may be erroneously programmed.

Additionally, reduced supply voltages in newer technologies results in smaller signals. As a result, fuse sense circuits operating at the lower supply voltages may not have sufficient gain to ensure accurate sensing.

Other issues common to integrated circuits must also be considered when designing circuits that sense the state of fuses. For example, voltage and current characteristics of integrated circuits typically change as the ambient temperature changes. Integrated circuits also have natural mismatches among components.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

A fuse sense circuit is described in detail herein. In the following description, numerous specific details are provided, such as particular currents, voltages, types of fuses, transistor types, and numbers of fuses to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
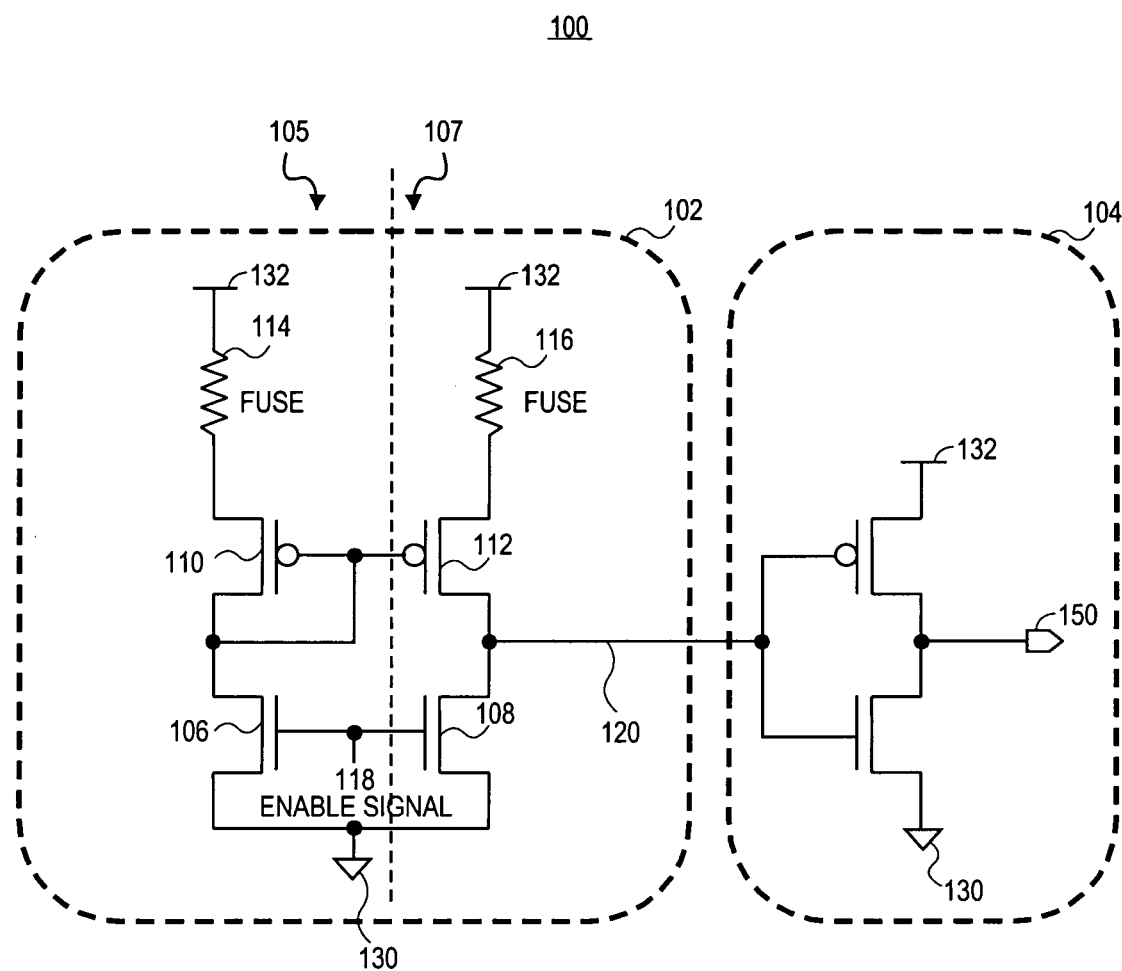
FIG. 1 is a schematic diagram of a prior art fuse sensing circuit.

FIG. 1 shows an integrated circuit comprising a prior art fuse sense circuit 100. The fuse sense circuit 100 includes a fuse sense amplifier 102 and a complementary metal oxide semiconductor (CMOS) inverter 104. The fuse sense circuit 100 includes two branches 105 and 107, each with two resistances 114 and 116, respectively, two loads 106 and 108, respectively, and two current mirror devices 110 and 112, respectively. The two branches 105 and 107 are coupled to each other in a current mirror configuration. The fuse sense amplifier 102 is coupled to the CMOS inverter 104 via a current mirror output node 120. The fuse sense circuit 100 is coupled to a voltage 130 and a voltage 132.

The fuse sense circuit 100 senses the state of the resistances 114 and 116 to determine whether either fuse is programmed. A sense enable signal node 118 is available to receive a sense enable signal, which, when operational, causes the fuse sense circuit 100 to sense the state of the resistances 114 and 116.

During sensing operations, which is when the sense enable signal is asserted, current sinks or sources through the resistances 114 and 116, thereby degenerating the voltages of the current mirror devices 110 and 112. The current mirror output node 120 has a potential (or voltage) that increases or decreases based on the state of the resistances 114 and 116. As the resistance 116 increases relative to the resistance 114, the current through the resistance 116, the current mirror device 112, and the load 108 decreases and the potential at the current mirror output node 120 is pulled towards the voltage 130. Conversely, as the resistance 116 decreases relative to the resistance 114, the current through the resistance 116, the current mirror device 112, and the load 108 increases and the potential at the current mirror output node 120 is pulled towards the voltage 132. The potential on the post amplifier output node 150 crosses the potential on the current mirror output node 120 at a voltage equal to the trip point of the CMOS inverter 104. This value is independent of whether or not the reference resistance 114 is equivalent to the sense resistance 116.

One limitation of the prior art fuse sense circuit 100 is that when the CMOS inverter 104 is used to interpret the potential at the current mirror output node 120 the result is a high sensitivity to process, voltage and temperature. For example, if the trip point for the CMOS inverter 104 is half the voltage 132, to make the potential at the current mirror output node 120 read a "1" across all conditions, the minimum value of the resistance 116 for a nominal value of the resistance 114 might be several times the value of the resistance 114.

Alternatively, it may be extremely difficult to make the potential at the current mirror output node 120 read other than a "0." This may be the case when the resistance 116 has a nominal value. In such a case, the resistance 116 may have a variety of values and the potential at the current mirror output node 120 still may read a "0."

Moreover, a small change in the CMOS inverter 104 trip point may dramatically influence the values of the resistances 114 and 116 that result in a current mirror output node 120 that is interpreted by the CMOS inverter 104 as a "1" or a "0".

Figure 2:
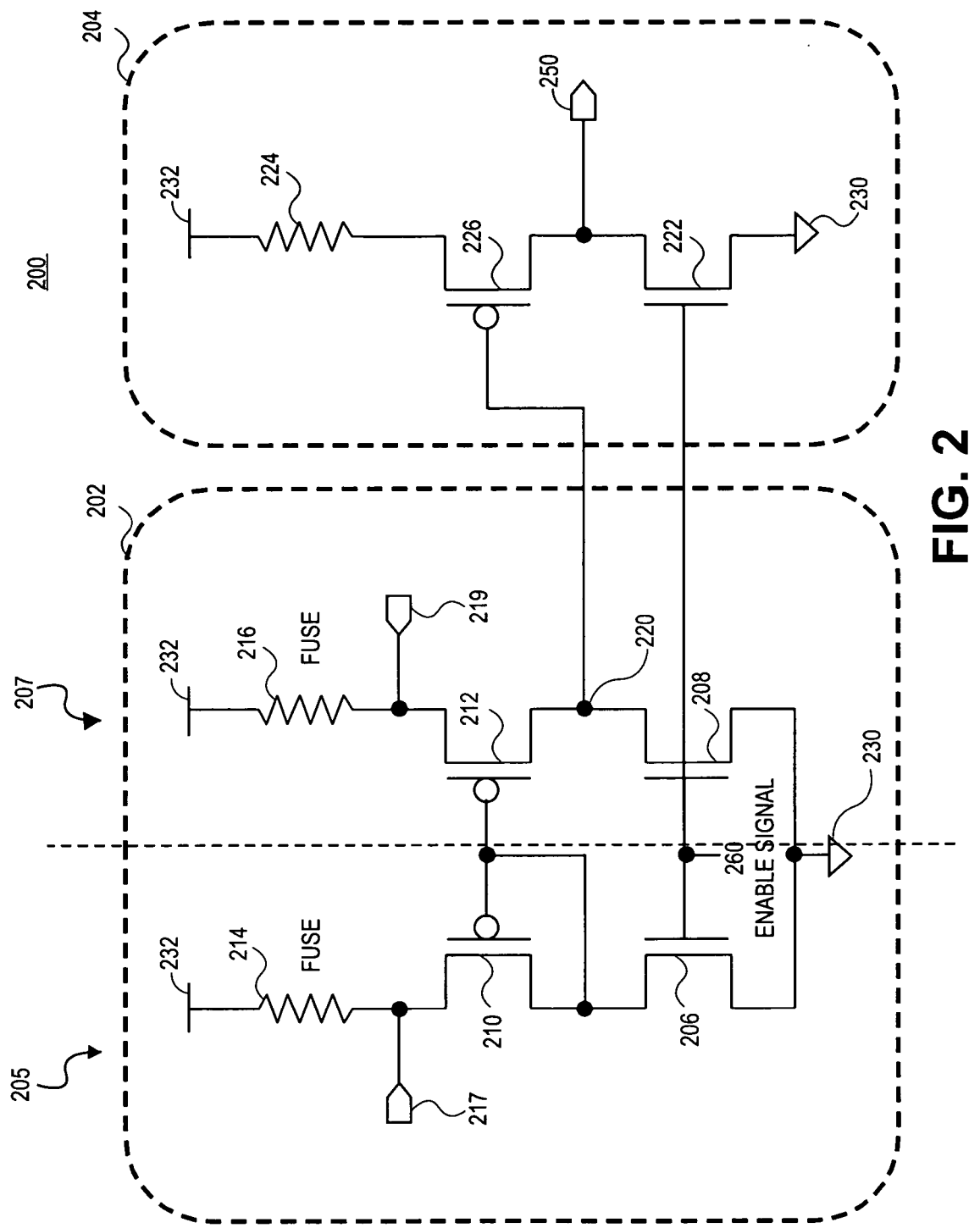
FIG. 2 is a schematic diagram of a fuse sense circuit with a fully matched gain stage according to an embodiment of the invention.

FIG. 2 illustrates an aspect of the invention that optimizes sensitivity to process, voltage and temperature using a single-ended post amplifier. FIG. 2 illustrates an exemplar fuse sense circuit 200, which has a fully matched gain stage. The fuse sense circuits according to aspects of the invention also accommodate greater mismatch among components.

The fuse sense circuit 200 has a sense amplifier 202 and a post amplifier 204. The sense amplifier 202 includes a reference branch 205 coupled to a sense branch 207 in a current mirror configuration. The post amplifier 204 coupled to the sense amplifier 202 via a current mirror output node 220.

The fuse sense circuit 200 also includes a reference load 206, a sense load 208, and a post amplifier load 222. Each of the loads 206, 208, and 222 has its source coupled to the voltage 230 and its drain coupled to the drain of a reference current mirror device 210, the drain of a sense current mirror device 212, and the drain of a post amplifier device 226, respectively. The source of the current mirror device 210, the source of the current mirror device 212, and the source of the post amplifier device 226 each are coupled to one terminal of a reference resistance 214, a sense resistance 216, and a post amplifier resistance 224, respectively. The opposite terminals of the reference resistance 214, the sense resistance 216, and the post amplifier resistance 224 are coupled to the voltage 232. The reference current mirror device 210 and the sense current mirror device 212 are coupled together in a current mirror configuration. The fuse sense circuit 200 is coupled to a voltage 232, which may be referred to as $V_{CC}$, and to a voltage 230, which may be referred to as $V_{SS}$.

The reference resistance 214 and the sense resistance 216 can both be implemented using fuse elements. Alternatively, the sense resistance 216 can be a fuse element and the reference resistance 214 can be a reference resistor, or a series of fuse elements forming a reference resistor. The implementation depends on the implementation of the sense amplifier 202, and is well known. The current mirror devices 210 and 212, as well as the post amplifier device 226, can be well-known p-channel MOS (PMOS) devices. Alternatively, the current mirror devices 210 and 212, and the post amplifier device 226 can be well-known n-channel MOS (NMOS) devices.

A sense enable signal can be coupled into the sense amplifier 202 and the post amplifier 204 via a sense enable input node 260. More specifically, the reference branch 205 can receive the sense enable signal via the gate of a reference load 206, to the sense branch 207 via the gate of a sense load 208, and to the post amplifier 204 via the gate of a post amplifier load 224.

Typically, the reference branch 205 and the sense branch 207 are programmed, via a program "zero" input 217 and a program "one" input 219, respectively. When the sense enable signal is asserted, the output of the sense amplifier 202 generates a potential at the current mirror output node 220 and thereby is coupled to the post amplifier 204. If the reference branch 205 is programmed, the sense branch is un-programmed, and the sense enable signal is asserted, the post amplifier output node 250 indicates a logical "one." Conversely, if the reference branch 205 is un-programmed, the sense branch 207 is programmed, and the sense enable signal is asserted, the post amplifier output node 250 indicates a logical "zero." Programming the fuse sense circuit 200 is accomplished using any well-known technique.

The post amplifier 204 is a gain stage with a trip point which, during operation, sufficiently tracks the voltage on the current mirror output node 220. In the embodiment depicted in FIG. 2, the post amplifier 204 is a scaled replica of the reference branch 205. This means that the devices in the post amplifier 204 are scaled to maintain the same ratio as similar devices in the reference branch 205, such that components in the post amplifier 204 each matches the components in the reference branch 205. For example, the post amplifier load 222, post amplifier resistance 224, and post amplifier device 226 each matches the reference load 206, the reference resistance 214, and the reference current mirror device 210, respectively.

An alternative embodiment includes the post amplifier 204 a scaled replica of the sense branch 207. Moreover, in one embodiment, the reference branch 205 and the sense branch 207 are identical.

Also, in an embodiment, the transistors in the reference branch 205 include multiple transistors in parallel "legged devices." In this embodiment, the scaled replica includes a subset of identical transistors of the reference branch 205.

Of course, multiple gain stages can be added to multiple sense branches for redundancy and single-ended sensing. From the description herein, persons of ordinary skill in the relevant art would understand how to implement such embodiments.

The fuse sense circuit 200 provides greater signal development than with prior art. Because the matched gain stage has a trip point that sufficiently tracks the reference voltage or the voltage in the reference branch, sensitivity to process, voltage, and temperature is reduced. This reduction in sensitivity allows a much lower differential resistance (between the reference and sense branches) to be accurately detected, even when the sense amplifier is not ideal. The fuse sense circuit 200 thereby accommodates greater mismatch of components.

The fuse sense circuit 200 provides more gain than the prior art fuse sense circuit 100 when a subsequent CMOS inverter is added, i.e., coupled to the post amplifier output node 250. The potential on the output of the added CMOS inverter would have a higher gain than the potential at the output of the CMOS inverter 104 (node 150). This embodiment also uses safe currents.

Figure 3:
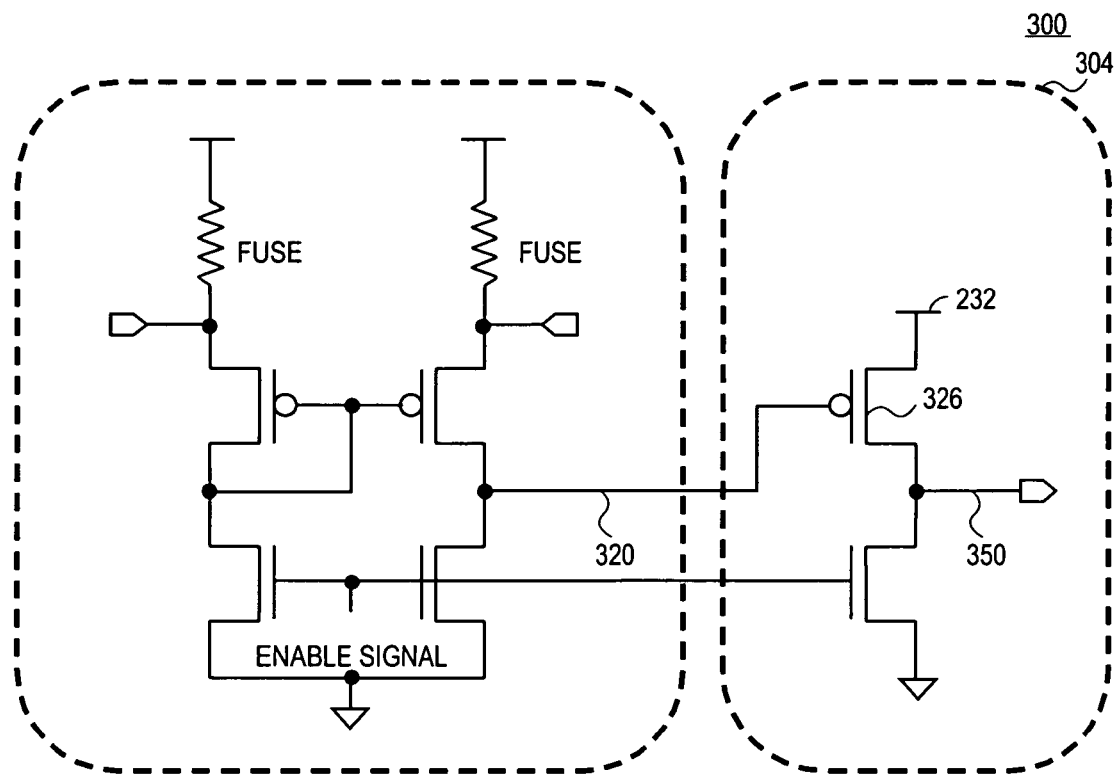
FIG. 3 is a schematic diagram of an exemplar fuse sense circuit with a transistor matched gain stage according to an embodiment of the invention.

A further gain increase is accomplished by eliminating the post amplifier resistance 224. This is shown in FIG. 3, which is an exemplar fuse sense circuit 300 with a transistor matched gain stage. Note that a post amplifier PMOS pull-up device 326 has its source tied to the voltage 232. When operating, the trip point of the post amplifier 304 sufficiently tracks the potential on the current mirror output node 320 as the trip point of the post amplifier 204 sufficiently tracks the potential on the current mirror output node 220. However, the potential on the post amplifier output node 350 has a gain higher than the potential on post amplifier output node 250. With no post amplifier resistance the trip point of the post amplifier 304 suffers only slightly.

In another embodiment, the post amplifier CMOS pull-up device 326 could be moved from exactly scaled to compensate for the removal of the resistance 224. However, in the spirit of the invention, the post amplifier 304 still sufficiently tracks.

Figure 4:
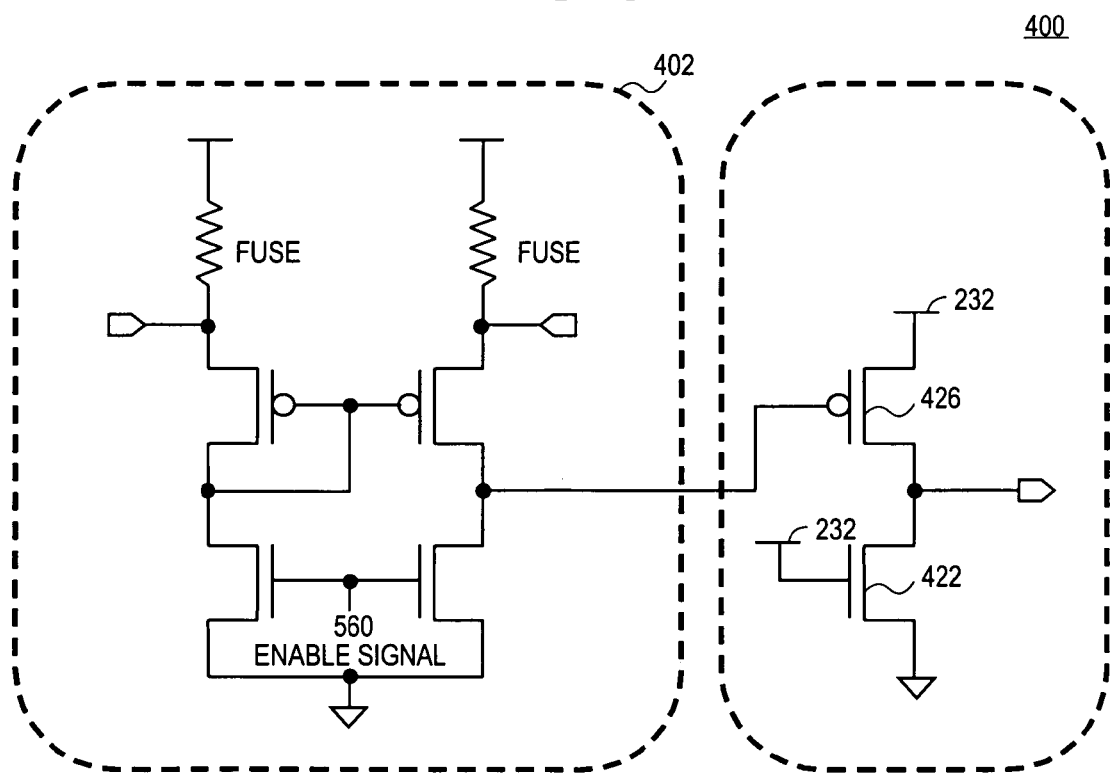
FIG. 4 is a schematic diagram of an exemplar fuse sense circuit with a matched gain stage according to an embodiment of the invention.

FIG. 4 shows an exemplar fuse sense circuit 400 with a matched gain stage. The fuse sense circuit 400 has a post amplifier device 426 with its source tied to the voltage and a post amplifier load 422 with its gate tied to the voltage 332 instead of a sense enable signal input node 260. This embodiment allows the post amplifier load 422 to pull down a post amplifier output node 450 when the sense amplifier 402 is powered down (i.e., when the sense enable signal is de-asserted).

The exemplar embodiments depicted by the fuse sense circuits 200, 300, and 400 have a threshold-programmed resistance for varied voltages. The threshold post-burn resistance for a program "one" and a program "zero" has been moved. For the same post-burn resistance, the fuse sense circuits 200, 300, and 400 allow accurate sensing at a much lower supply voltage. This feature greatly reduces the threshold supply voltage for which the integrated circuit can be designed.

Figure 5:
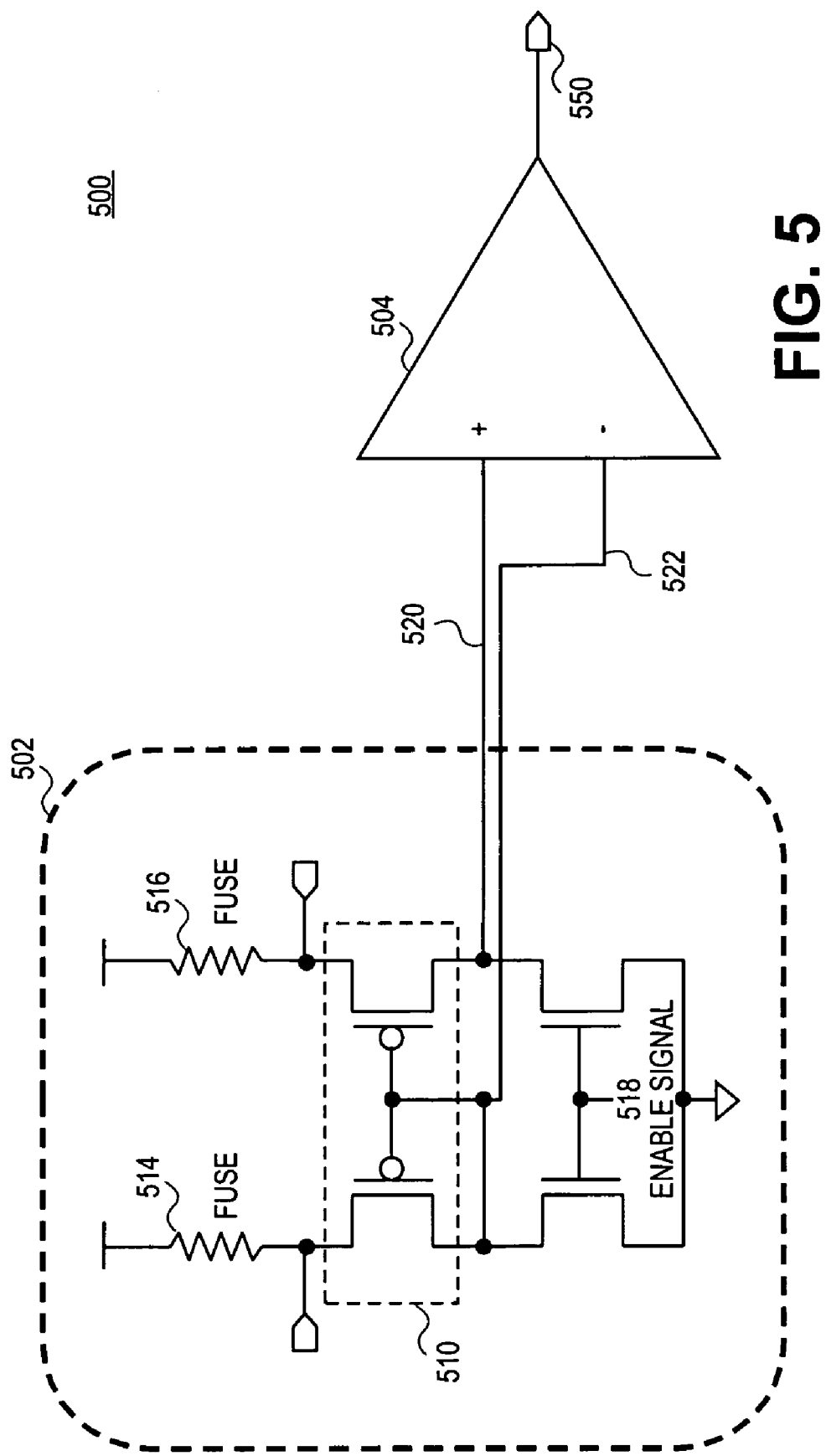
FIG. 5 is a schematic diagram of an exemplar fuse sense circuit sensed differentially according to an embodiment of the invention.

In an alternative embodiment, one aspect of the invention optimizes sensitivity to process, voltage and temperature using a post amplifier to interpret the potential at the current mirror output node 120 differentially. FIG. 5 is a schematic diagram of a fuse sense circuit 500 according to an embodiment of the invention operated differentially. The fuse sense circuit 500 includes a sense amplifier 502 and a differential amplifier 504. The sense amplifier 502 includes a current mirror 510 and two resistances 514 and 516. A sense enable signal node 518 is available to receive a sense enable signal, which, when operational, causes the fuse sense circuit 500 to sense the state of the resistances 514 and 516. The sense amplifier 502 is coupled to the non-inverting input of the differential amplifier 504 at a current mirror output node 520 and to the inverting input of the differential amplifier 504 at a current mirror output node 522.

When the potential at the current mirror output node 520 is exactly equal to the drain voltage of the current mirror device 510 the differential amplifier 504 will trip. If the resistance 514 is programmed, the resistance 516 is un-programmed, and a sense enable signal (or enable signal) is asserted on the sense enable node 518, the differential amplifier output node 550 indicates a logical "one." Conversely, if the resistance 514 is un-programmed, the resistance 516 is programmed, and the sense enable signal is asserted on the sense enable node 518, the differential amplifier output node 550 indicates a logical "zero." For perfectly matched transistors, the differential amplifier 504 trips when the resistances 514 and 516 are equal to each other.

Examination of the fuse sense circuit 500 also reveals that at or near the differential amplifier 504 trip point, the voltage at the drain of current mirror device 510 does not vary significantly with changes in either of the resistances 514 and 516. Moreover, the trip point of the differential amplifier 504 behaves more like a reference voltage rather than a trip point. This indicates that a single-ended post amplifier, as described above, could perform substantially as well as the differential amplifier 504 if the trip point of the single-ended post amplifier sufficiently followed the voltage at the drain voltage of current mirror device 510.

Other example embodiments include implementations involving other single-ended fuse cells. Although many of the embodiments shown herein implement NMOS loads and PMOS current mirrors, the complement of the fuse sense circuits described herein, whose implementation would be readily recognized using the description herein, function in the same manner for fuse sense circuits that have PMOS loads and NMOS current mirrors.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A resistance sense circuit, comprising:
   first circuit branch;
   second circuit branch coupled to the first branch in a current mirror configuration;
   an amplifier coupled to the second circuit branch, the amplifier comprising a load having it's gate coupled to a first voltage and it's source coupled to a second voltage, and an output node; and
   an enable node coupled to the first circuit branch and the second circuit branch to turn the current mirror on to enable the resistance sense circuit to indicate a logical state at the output node if an enable signal is asserted on the enable node, the first circuit branch is un-programmed and the second circuit branch is programmed.

2. The resistance sense circuit of claim 1 the output node further to indicate a value approximately equal to the first voltage if the enable signal is asserted and to indicate a value approximately equal to the second voltage if the enable signal is de-asserted.

3. The resistance sense circuit of claim 1, further comprising:
   first input node coupled to the second circuit branch to program the second circuit branch with a first logical state; and
   second input node coupled to the first circuit branch to program the first circuit branch with a second logical state.

4. The resistance sense circuit of claim 1, further comprising:
- first resistance and second resistance each having one terminal coupled to a voltage;
- first and second current mirror device each having one terminal coupled to an opposite terminal of the first and second resistance, respectively, the first current mirror device coupled to the second current mirror device in a current mirror configuration;
- third current mirror device matching the first current mirror device, the third current mirror device having a gate coupled to a second circuit branch output node and a source coupled to the voltage; and
- first and second load each having one terminal coupled to an opposite terminal of the first and second current mirror device, respectively.

5. The resistance sense circuit of claim 4, further comprising:
- first input node coupled between the second current mirror device and the second resistance to program the second resistance with a first logical state; and
- second input node coupled between the first current mirror device and the first resistance to program the first resistance with a second logical state.

6. The resistance sense circuit of claim 1, wherein the first circuit branch further comprises a first resistance and the second circuit branch comprises a second resistance.

7. The resistance sense circuit of claim 6, the first resistance further comprising a resistor and the second resistance further comprising a fuse element.

* * * * *